(12) United States Patent
Jain et al.

(10) Patent No.: US 10,586,524 B1
(45) Date of Patent: Mar. 10, 2020

(54) SYSTEMS AND METHODS FOR DETECTING DIVERGENCE IN AN ADAPTIVE SYSTEM

(71) Applicant: Bose Corporation, Framingham, MA (US)

(72) Inventors: Ankita D. Jain, Westborough, MA (US); Wade P. Torres, Attleboro, MA (US); Eric Raczka Bernstein, Cambridge, MA (US)

(73) Assignee: Bose Corporation, Framingham, MA (US)

( * ) Notice: Subject to any disclaimer, the term of this patent is extended or adjusted under 35 U.S.C. 154(b) by 0 days.

(21) Appl. No.: 16/369,620

(22) Filed: Mar. 29, 2019

(51) Int. Cl.
  *G10K 11/178* (2006.01)
  *G01R 21/133* (2006.01)

(52) U.S. Cl.
  CPC ...... *G10K 11/17879* (2018.01); *G01R 21/133* (2013.01); *G10K 11/17823* (2018.01); *G10K 11/17825* (2018.01)

(58) Field of Classification Search
  None
  See application file for complete search history.

(56) References Cited

U.S. PATENT DOCUMENTS 8,369,512 B2 * 2/2013 Le Tourneur ............ H04B 3/23
                                                370/289
9,704,471 B1 * 7/2017 Ku .......................... F01N 1/065

* cited by examiner

*Primary Examiner* — James K Mooney
(74) *Attorney, Agent, or Firm* — Bond, Schoeneck & King, PLLC

(57) ABSTRACT

A system for detecting divergence in a noise-cancellation system, comprising: a controller configured to: determine a power of a component of the error signal, the component being correlated to the at least one reference sensor signal; determine an average value, over a first time period, of a value representative of a time gradient of the power of the component of the error signal; and determine whether the average value is greater than a threshold.

20 Claims, 13 Drawing Sheets

SYSTEMS AND METHODS FOR DETECTING DIVERGENCE IN AN ADAPTIVE SYSTEM

BACKGROUND

The present disclosure generally relates to systems and methods for detecting divergence in an adaptive system.

SUMMARY

All examples and features mentioned below can be combined in any technically possible way.

According to an aspect, a system for detecting divergence in a noise-cancellation system, includes: a controller configured to: determine a power of a component of an error signal, the component being correlated to at least one reference signal; determine an average value, over a first time period, of a value representative of a time gradient of the power of the component of the error signal; and determine whether the average value is greater than a threshold.

In an example, the controller is further configured to normalize the power of the component according to a total power of the at least one reference signal.

In an example, the value representative of the time gradient is a smoothed time gradient of the power of the component.

In an example, the smoothed time gradient discounts new values of the time gradient.

In an example, the smoothed time gradient is an exponential moving average of the time gradient.

In an example, the value representative of the time gradient is set to a first flag value when the time gradient of the power of the component is above a gradient threshold and set to a second flag value when the time gradient of the power of the component is below the gradient threshold.

In an example, the controller is configured to weight at least one frequency of the component of the error signal higher than at least one other frequency of the component of the error signal.

In an example, the controller is configured to determine a second average value of a second value representative of the time gradient of the power of the component over a second time period; and to determine whether the average value or the second average value is greater than the threshold.

In an example, the second time period is greater than the first time period.

In an example, the controller is further configured to: determine a second power of a component of a second error signal, the component of the second error signal being correlated to the at least one reference signal; determine a second average value, over the first time period, of a value representative of a time gradient of the second power of the component of the second error signal; and determine whether the second average value is greater than the threshold.

In an example, the system further includes an error sensor outputting the error signal.

In an example, the system further includes at least one reference sensor outputting the at least one reference signal.

According to another aspect, a method for detecting divergence in a noise-cancellation system, includes: determining a power of a component of an error signal, the component being correlated to at least one reference signal; determining an average value, over a first time period, of a value representative of a time gradient of the power of the component of the error signal; and determining whether the average value is greater than a threshold.

In an example, the further includes the steps of normalizing the power of the component according to a total power of the at least one reference signal.

In an example, the value representative of the time gradient is a smoothed time gradient of the power of the component.

In an example, the smoothed time gradient discounts new values of the time gradient.

In an example, the smoothed time gradient is an exponential moving average of the time gradient.

In an example, the value representative of the time gradient is set to a first flag value when the time gradient of the power of the component is above a gradient threshold and set to a second flag value when the time gradient of the power of the component is below the gradient threshold.

In an example, the method further includes the steps of weighting at least one frequency of the component of the error signal higher than at least one other frequency of the component of the error signal.

In an example, the method further includes the steps of determining a second average value of a second value representative of the time gradient of the power of the component over a second time period; and determining whether the average value or the second average value is greater than the threshold.

The details of one or more implementations are set forth in the accompanying drawings and the description below. Other features, objects, and advantages will be apparent from the description and the drawings, and from the claims.

DETAILED DESCRIPTION

Adaptive systems, such as noise-cancellation systems, typically employ feedback or feedforward topologies to adjust the adaptive system parameters according to the requirements of the environment. Generally, these systems will converge to a state that minimizes a particular value. For example, a noise-cancellation system may adapt parameters according to feedback from an error sensor in order to minimize noise within a particular area. In this case, the noise-cancellation system will converge toward zero noise within the area.

However, if an adaptive system fails, the system may diverge from the particular value. In a worst case scenario, this will exacerbate, rather than minimize the intended value. Again, in the noise-cancellation example, a noise-cancellation system that diverges may add noise to the area, rather than cancel noise.

Various examples disclosed herein are directed to a system for detecting divergence in an adaptive system, such as a noise cancellation system. In some examples, once a divergence is detected, a corrective action may be taken to mitigate the effect of the divergence on the adaptive system.

Figure 1:
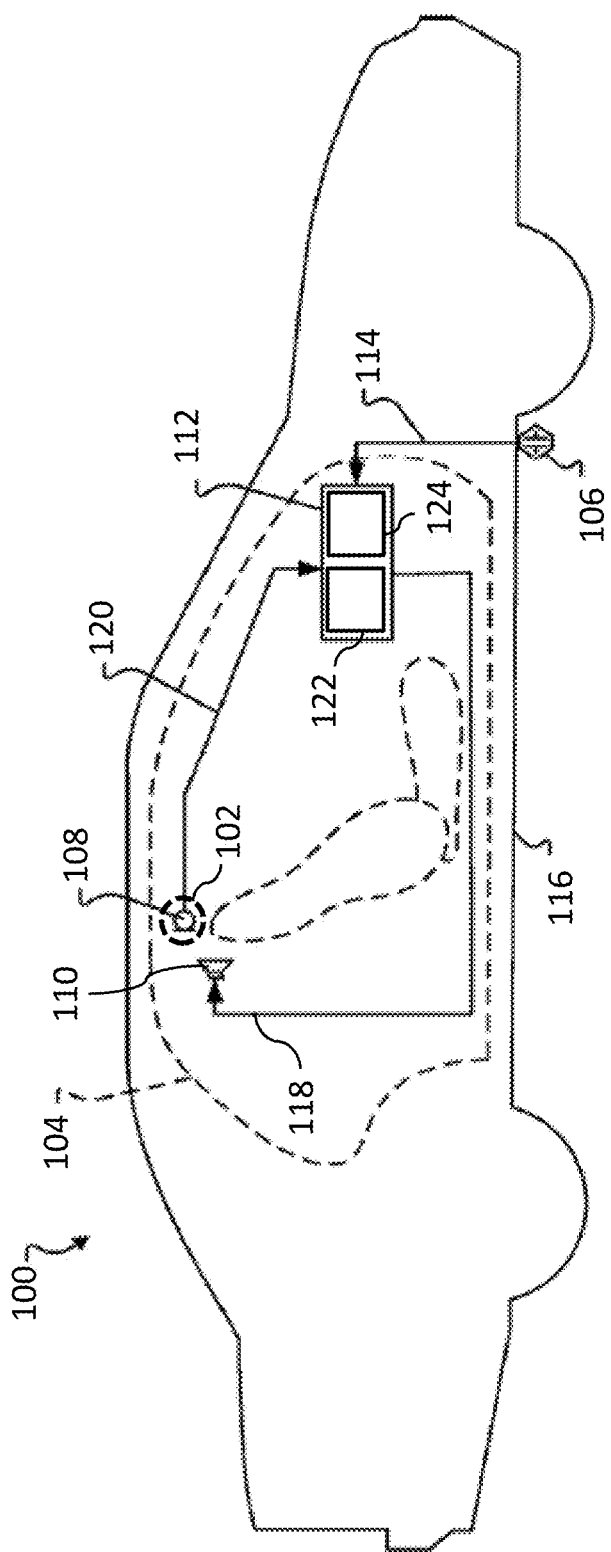
FIG. 1 depicts a schematic of a noise-cancellation system, according to an example.

As mentioned, one adaptive system is a noise-cancellation system, such as the road road-noise cancellation system 100 depicted in FIG. 1. Road-noise cancellation system 100 may be configured to destructively interfere with undesired sound in at least one cancellation zone 102 (e.g., near a passenger's head) within a predefined volume 104 such as a vehicle cabin. At a high level, an example of road-noise cancellation system 100 may include a reference sensor 106, an error sensor 108, an actuator 110, and a controller 112.

In an example, reference sensor 106 is configured to generate reference sensor signal(s) 114 representative of the undesired sound, or a source of the undesired sound, within predefined volume 104. For example, as shown in FIG. 1, reference sensor 106 may be an accelerometer, or a plurality of accelerometers, mounted to and configured to detect vibrations transmitted through a vehicle structure 116. Vibrations transmitted through the vehicle structure 116 are transduced by the structure into undesired sound in the vehicle cabin (perceived as road noise), thus an accelerometer mounted to the structure provides a signal representative of the undesired sound.

Actuator 110 may, for example, be speakers distributed in discrete locations about the perimeter of the predefined volume. In an example, four or more speakers may be disposed within a vehicle cabin, each of the four speakers being located within a respective door of the vehicle and configured to project sound into the vehicle cabin. In alternate examples, speakers may be located within a headrest or in the rear deck, or elsewhere in the vehicle cabin.

A noise-cancellation signal 118 may be generated by controller 112 and provided to one or more speakers in the predefined volume, which transduce the noise-cancellation signal 118 to acoustic energy (i.e., sound waves). The acoustic energy produced as a result of noise-cancellation signal 118 is approximately 180° out of phase with—and thus destructively interferes with—the undesired sound within the cancellation zone 102. The combination of sound waves generated from the noise-cancellation signal 118 and the undesired noise in the predefined volume results in cancellation of the undesired noise, as perceived by a listener in a cancellation zone.

Because noise-cancellation cannot be equal throughout the entire predefined volume, road-noise cancellation system 100 is configured to create the greatest noise-cancellation within one or more predefined cancellation zones 102 with the predefined volume. The noise-cancellation within the cancellation zones may affect a reduction in undesired sound by approximately 3 dB or more (although in varying examples, different amounts of noise-cancellation may occur). Furthermore, the noise-cancellation may cancel sounds in a range of frequencies, such as frequencies less than approximately 350 Hz (although other ranges are possible).

Error sensor 108, disposed within the predefined volume, generates an error sensor signal 120 based on detection of residual noise resulting from the combination of the sound waves generated from the noise-cancellation signal 118 and the undesired sound in the cancellation zone. The error sensor signal 120 is provided to controller 112 as feedback, error sensor signal 120 representing residual noise uncancelled by the noise-cancellation signal. Error sensors 108 may be, for example, at least one microphone mounted within a vehicle cabin (e.g., in the roof, headrests, pillars, or elsewhere within the cabin).

It should be noted that the cancellation zone(s) may be positioned remotely from error sensor 108. In this case, the error sensor signal 120 may be filtered to represent an estimate of the residual noise in the cancellation zone(s). Furthermore, the error sensor signal 120 may be formed from an array of error sensors 108 (e.g., microphones), and/or other signals, in order to generate the estimate of residual noise in a cancellation zone remote from one or more of the array of error sensors 108. Indeed, it should be understood that any given error signal, as used in this application, may be directly received from one or more error sensors 108 or may be the result of some filtering applied to the signal(s) 120 received from one or more error sensors 108 and/or other signals. Regardless of the number of error sensors 108 used, or the filtering applied to the error sensors signal 120, in the road-noise cancellation system 100 context the error signal will be understood to represent residual undesired noise in the cancellation zone.

In an example, controller 112 may comprise a nontransitory storage medium 122 and processor 124. In an example, non-transitory storage medium 122 may store program code that, when executed by processor 124, implements the noise-cancellation and divergence detection systems and methods described below. Controller 112 may be implemented in hardware and/or software. For example, controller 112 may be implemented by a SHARC floating-point DSP processor, but it should be understood that controller 112 may be implemented by any other processor, FPGA, ASIC, or other suitable hardware.

Figure 2:
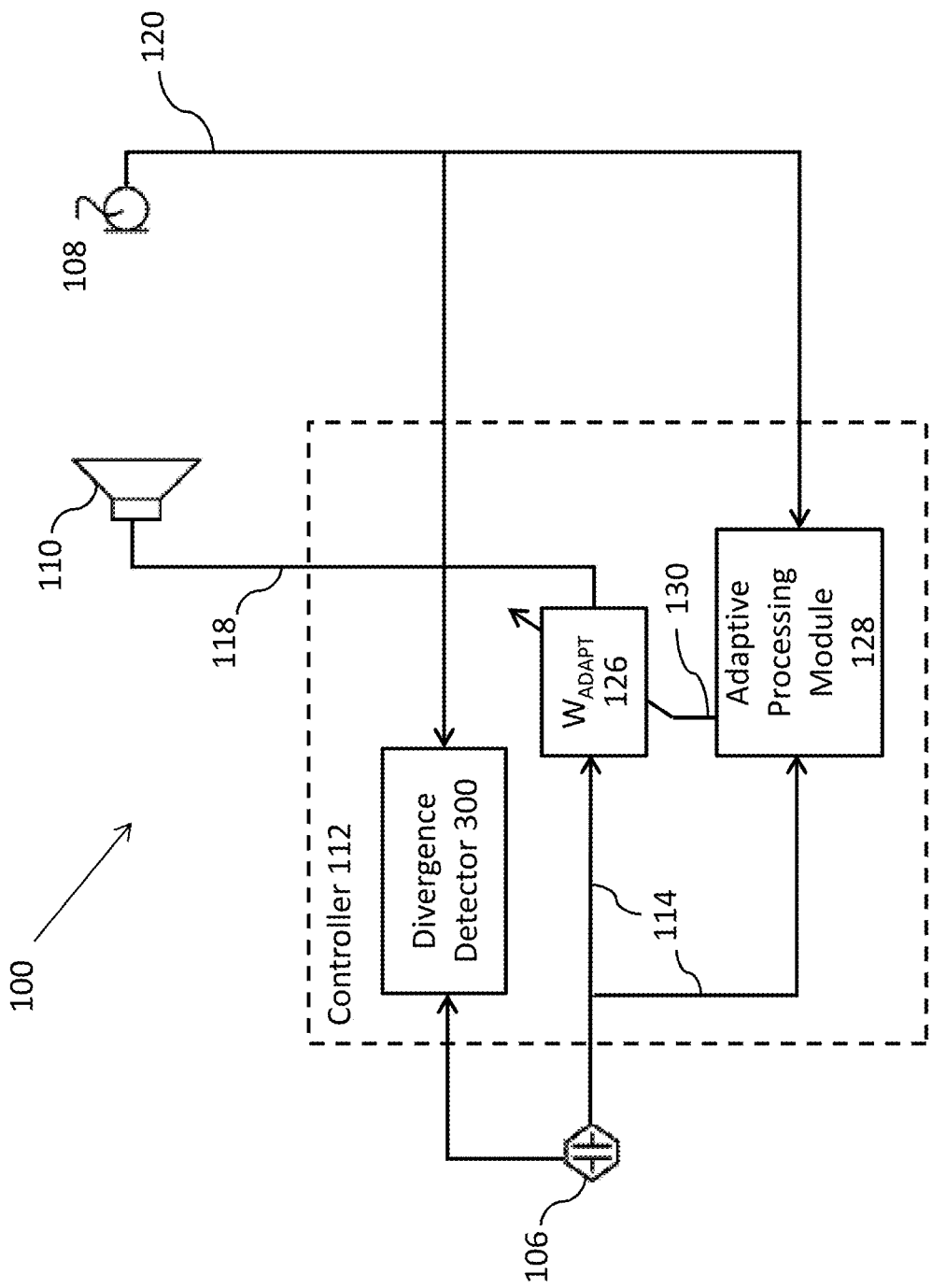
FIG. 2 depicts a block diagram of a noise-cancellation system, according to an example.

Turning to FIG. 2, there is shown a block diagram of an example of road-noise cancellation system 100 with divergence detection, including a plurality of filters implemented by controller 112. As shown, controller 112 may define a control system including $W_{adapt}$ filter 126 and an adaptive processing module 128.

$W_{adapt}$ filter 126 is configured to receive the reference sensor signal 114 of reference sensor 106 and to generate noise-cancellation signal 118. Noise-cancellation signal 118, as described above, is input to actuator 110 where it is transduced into the noise-cancellation audio signal that destructively interferes with the undesired sound in the predefined cancellation zone 102. $W_{adapt}$ filter 126 may be implemented as any suitable linear filter, such as a multi-input multi-output (MIMO) finite impulse response (FIR) filter. $W_{adapt}$ filter 126 employs a set of coefficients which define the noise-cancellation signal 118 and which may be adjusted to adapt to changing behavior of the nonlinear vehicle response to road input.

The adjustments to the coefficients may be performed by an adaptive processing module 128, which receives as inputs the error sensor signal 120 and the reference sensor signal 114 and, using those inputs, generates a filter update signal 130. The filter update signal 130 is an update to the filter coefficients implemented in $W_{adapt}$ filter 126. The noise-cancellation signal 118 produced by the updated $W_{adapt}$ filter 126 will minimize error sensor signal 120, and, consequently, the undesired noise in the cancellation zone.

The coefficients of $W_{adapt}$ filter 126 at time step n may be updated according to the following equation:

$$W_{adapt}[n+1] = W_{adapt}[n] + \mu(\tilde{T}'_{de} * y)\frac{x}{\|x\|_2} \quad (1)$$

where $\tilde{T}_{de}$ is an estimate of the physical transfer function between actuator 110 and the noise-cancellation zone 102, $\tilde{T}'_{de}$ is the conjugate transpose of $\tilde{T}_{de}$, y is the error signal, and x is the output signal of reference sensor 106. In the update equation, the output signal x of reference sensor is divided by the norm of x, represented as $\|x\|_2$.

Divergence detector 300, as described in detail below, receives error sensor signal 120 and reference sensor signal 114, and, using those inputs, determines whether road-noise cancellation system 100 is likely diverging. The road-noise cancellation system 100, in response to that measure, may take corrective action to mitigate the divergence.

When road-noise cancellation system 100 is working properly, it should converge toward no road-noise in the cancellation zone, and, thus, there should be little content of the error signal that is correlated to the reference signal within the cancellation zone(s) 102. An increase in correlated content in the error signal is, therefore, an indication of divergence. The divergence detector 300, at a high level, thus functions to detect increases in correlated content within the error signal 120.

Figure 3:
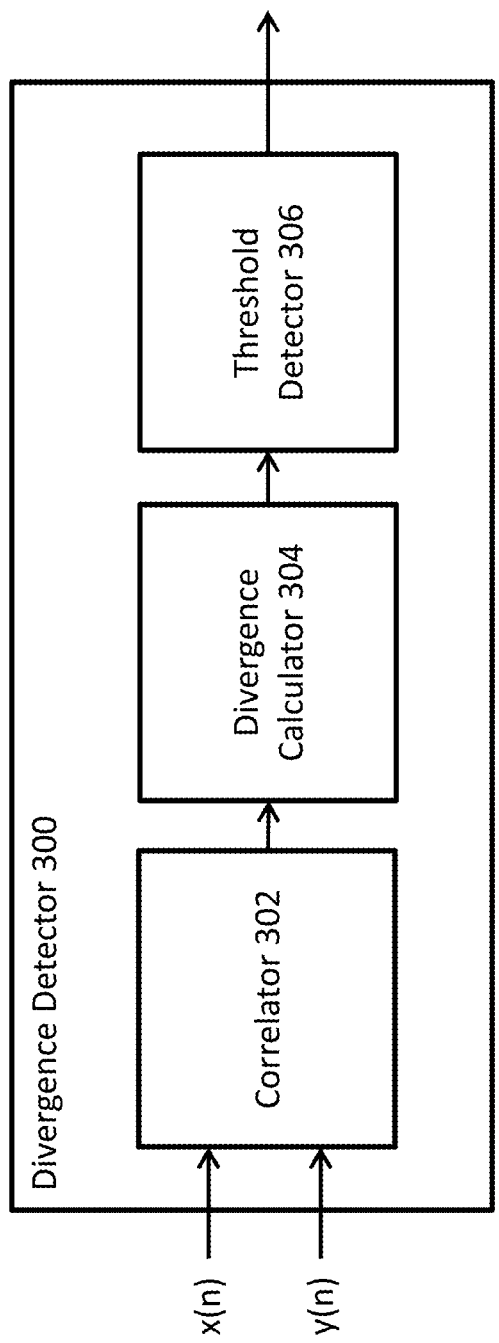
FIG. 3 depicts a block diagram of a divergence detector, according to an example.

FIG. 3 is an example divergence detector 300 for detecting divergence in an adaptive system, such as road-noise cancellation system 100. As shown, divergence detector 300 may include a correlator 302, a divergence calculator 304, and a threshold detector 306. In this example, divergence calculator 304 receives from correlator 302 a power of a component of the error sensor signal y(n) that is correlated to an input signal x(n), and, from that, determines a time average of a value representative of a time gradient of the correlated power of the error sensor signal y(n). Threshold detector 306 receives the time average of the value representative of the time gradient of the correlated power from the divergence calculator 304 and compares it to a user-defined threshold.

As described above, correlator 302 outputs a signal representative of a power of a component of the error sensor signal y(n), correlated to one or more input signals x(n). Again, as mentioned above, error sensor signal y(n) may be received from a single error sensor or may be a combination of multiple error sensor signals and/or other signals. In addition, the error sensor signal y(n) may be filtered before being input to divergence detector 300. It should also be understood that the input signal x(n) represents the signal or signals input to the adaptive system, representative of the environment or context to which the adaptive system adapts. In the example of the road-noise cancellation system 100, the input signals are reference sensor signals 114, e.g., accelerometer signals.

The function of the correlator 302 may be broken into at least two separate tasks: (1) finding a component of the error sensor signal y(n) correlated to one or more input signals x(n), and (2) finding the power of said component of the error sensor signal y(n) that is correlated to the one or more input signals x(n) received from, e.g., one or more reference sensors such as reference sensors 106.

In the example of road-noise cancellation system 100, the reference sensor 106 may be positioned to detect vibrations in the vehicle structure that are perceived by a passenger as road noise, while the error sensor 108 may be positioned to detect all noise within the cabin or a subset of noise within the cabin (e.g., noise falling within a particular cancellation zone and within a particular frequency range). In this example, the error sensor 108 will detect additional noises in the cabin that are not the result of road noise, e.g., not the result of vibrations in the vehicle structure, such as music playing within the cabin, the talking of passengers within the cabin, wind passing by the vehicle, etc. The error sensor signal y(n) may thus be represented as a sum of its components, as follows:

$$y(n) = y_a(n) + y_{resi}(n) \quad (2)$$

where $y_a(n)$ is the component of the error sensor signal y(n) correlated with the input signal x(n), and $y_{resi}(n)$ is the residual component that is uncorrelated with the input signal x(n). Because the adaptive system, in the road-noise cancellation system 100 context, is adapted to limit the road noise, the noises detected by the error sensor 108 not related to road noise (i.e., the components not correlated to the reference sensor 106), are not indicative of whether the adaptive system is diverging or converging. Thus, the correlator 302 is configured to correlate the error sensor signal y(n) to the input signal x(n), thereby eliminating extraneous inputs to the error sensor 108.

Correlator 302 may find the power of the error sensor signal y(n) either before or after correlating the error sensor signal y(n) to the input signal x(n). For example, the correlator 302 may first determine the power of the error sensor 108, and then determine what component of the power of the error sensor signal y(n) is correlated to the power of the input signal x(n). (Such a system is shown, for example, in FIG. 4.) Alternatively, the correlator 302 may first determine the components of the error sensor signal y(n) is correlated to the input signals x(n) and then determine the power of the correlated component. In either case, the output of the correlator is the power of the component of the error sensor signal y(n) correlated with the input signal x(n).

Figure 4:
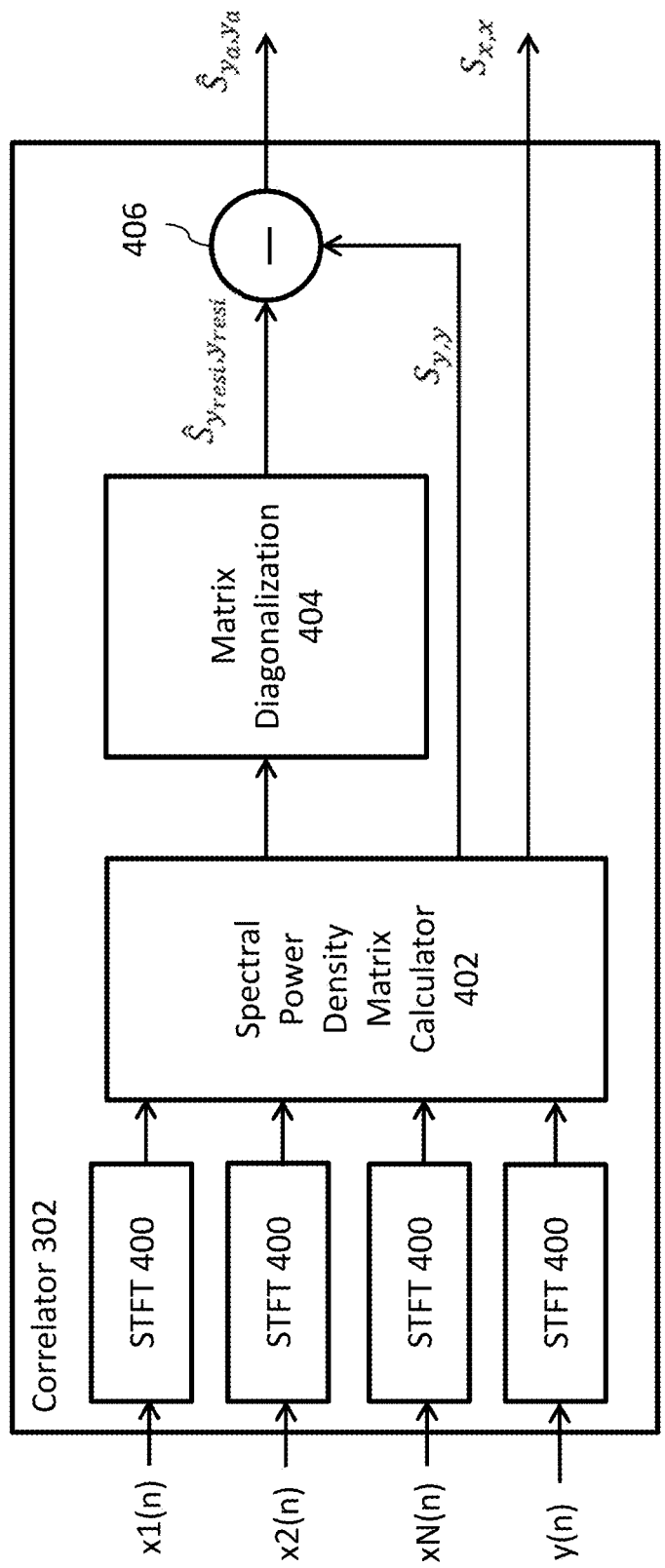
FIG. 4 depicts a block diagram of a correlator, according to an example.

FIG. 4 depicts one example of a correlator 302. In this example, the input signals, collectively represented as x1(n), x2(n), . . . xN(n) (signifying that any number of input signals may be used), and the error sensor signal y(n) are each input to a short-time Fourier transform 400, which computes the Fourier transform and outputs the spectrum with respect to frequency for each respective signal. It should be understood that, although a short-time Fourier transform is shown, any suitable Fourier transform or Fourier-related transform algorithm that transforms the input signal to the frequency domain (e.g., DCT) may be implemented in alternate examples. Because the input (y(n), x1(n), x2(n), . . . xN(n)) is a running time series, where each time sample is received sequentially, the input signal may be buffered and the FFT or FFT-related algorithm performed on that buffer. Any suitable FFT algorithm or FFT-related algorithm may thus include additional buffering and windowing to account for the running time series input. Furthermore, it should be understood that the FFT or FFT-related algorithm may be limited to a frequency band of interest. For example, in the road-noise cancellation context, the output of STFT 400 may be limited to a range such as 60 Hz to 300 Hz, as this is generally the frequency band in which road noise is cancelled.

The outputs of the STFT 400 are input to a cross spectral density matrix calculator 402, which determines a cross spectral density matrix. Inputting the output of the cross spectral density matrix to a matrix diagonalization 404 will yield an estimate of $\hat{S}_{y_{resi},y_{resi}}$, the power spectral density of the uncorrelated component of the error sensor signal. Because $S_{y,y}$, the power spectral density (which is the last diagonal term of the cross spectral density matrix) of the error sensor signal, is the sum of the power spectral density of the correlated ($S_{y_a,y_a}$) and uncorrelated ($S_{y_{resi},y_{resi}}$) components:

$$S_{y,y} = S_{y_a,y_a} + S_{y_{resi},y_{resi}} \quad (3)$$

subtracting $\hat{S}_{y_{resi},y_{resi}}$ from $S_{y,y}$ will yield $\hat{S}_{y_a,y_a}$ an estimate of the power spectral density of the correlated component of error output signal, as follows:

$$S_{y,y} - S_{y_{resi},y_{resi}} = \hat{S}_{y_a,y_a} \quad (4)$$

That is to say, subtracting, by subtractor 406, the diagonalization of the cross spectral density matrix from $S_{y,y}$ (the last diagonal entry of the cross spectral density matrix) will yield $\hat{S}_{y_a,y_a}$, the estimate of the power spectral density of the component of the error sensor signal y(n), correlated with the input signals x1(n), x2(n), . . . xN(n).

It should be understood the estimate of the power of the correlated component $\hat{S}_{y_a,y_a}$ of the error sensor signal y(n), correlated with the input signals x1(n), x2(n), . . . xN(n), may be calculated in other suitable ways. Indeed, multiple methods exist, for example, of calculating the power spectral density and for calculating the cross-correlation between the error sensor signal and the input signals—any of such methods may be suitable in various examples. In addition, it should be understood that a power spectral density is only one way of representing the power of a signal (i.e., with respect to frequency) and that, in other examples, different methods of representing a power of signal may be used to calculate the correlated power $\hat{S}_{y_a,y_a}$ (and other powers referred to in this disclosure). The correlated component $\hat{S}_{y_a,y_a}$ is input to the divergence calculator 304.

Figure 5A:
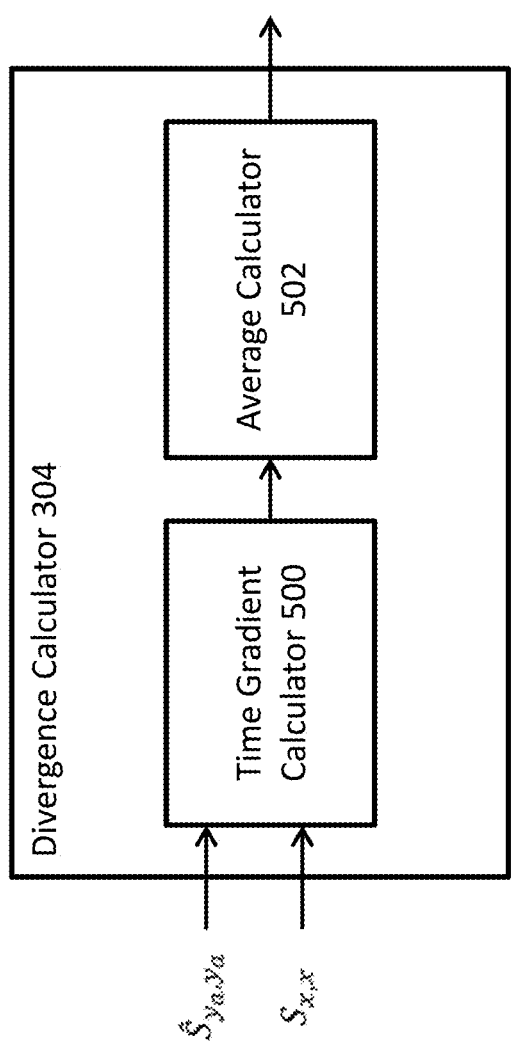
FIG. 5A depicts a block diagram of a divergence calculator, according to an example.

In addition to the correlated power $\hat{S}_{y_a,y_a}$ of the error sensor signal, the power of the input signals may be input to the divergence calculator 304. This is shown, for example, in FIG. 4, in which the first N diagonal terms of the cross spectral density matrix are summed, to yield the sum of the power spectral densities of the input signals, given by:

$$S_{x,x}[n,k] = \sum_j S_{a_j,a_j}[n,k] \quad (5)$$

at time index n and frequency bin k. The sum of the power spectral densities of the input signals $S_{x,x}[n, k]$, is then input to divergence calculator 304, as shown in FIG. 5A.

The power spectral densities calculated above, may, for example, use a frame size of 256 bins. Preferably, the resolution should be at least as much as that of the adaptive filters, which, in an example, is 125 taps. Furthermore, a length of time average window for calculating the power spectral densities may be approximately 50 seconds, although other lengths of time may be used. A length of time overlap for adjacent frames during the power spectral density calculation may be approximately 95%, such that the rate for estimation of divergence is approximately every 3.2 seconds. It will be understood, in conjunction with a review of this disclosure, that these parameters may be tuned to fit the context of the divergence detector 300 and requirements of the adaptive system.

Divergence detector 300 is configured to determine a likelihood of whether the correlated power $\hat{S}_{y_a,y_a}$ is diverging (e.g., increasing, presumably without bound or without returning to an acceptable level). Of course, any adaptive system will experience periods of growth and periods of convergence. For example, road-noise cancellation system 100 will, if operating correctly, generally cancel road noise present in the cabin, and so the correlated power $\hat{S}_{y_a,y_a}$ of the sensor signal will generally converge toward zero. However, as the characteristics of the road noise change and the road-noise cancellation system adapts to those changes, there will be periods where the road noise will grow in the cabin (and thus the power of the correlated components of the error sensor signal will grow). As long as the noise-cancellation system 100 adapts to these changes, and the correlated power $\hat{S}_{y_a,y_a}$ again converges toward zero, this is not problematic; rather, it indicates that the adaptive system is working properly. If, however, the road noise begins to grow unchecked, and the adaptive system fails to cancel it, or, worse, adds to it, then such may be indicative that the adaptive system is diverging.

As described above, to determine whether the adaptive system is likely diverging, divergence detector 300 may comprise a divergence calculator 304 and a threshold detector 306. Divergence calculator 304 may average, over time, a value representative of a time gradient of the correlated power $\hat{S}_{y_a,y_a}$. This average value, which corresponds to an estimate of the degree of divergence of the adaptive system, may be input to a threshold detector 306, which compares the determined degree of divergence to a user-defined threshold. If the threshold is exceeded, a corrective action may be taken, as will be described below.

As shown in FIG. 5A, divergence calculator 304 may include, in an example, a time gradient calculator 500 and average calculator 502. The correlated power $\hat{S}_{y_a,y_a}[n, k]$ input to the time gradient calculator 500 may be the correlated power itself, or the correlated power in decibels as determined, for example, by:

$$G[n,k] = 10 \log_{10}(\hat{S}_{y_a,y_a}[n,k]) \quad (6)$$

where $\hat{S}_{y_a,y_a}[n, k]$, again, is the correlated power at sample n and frequency bin k.

Because a change in environment that yields greater road noise (or other higher-power signals in other adaptive systems) will typically result in a momentary increase in input power and the correlated power $\hat{S}_{y_a,y_a}[n, k]$, it is also useful to normalize the correlated power $\hat{S}_{y_a,y_a}[n, k]$ by a value that will reflect the increase in input signal power. Such a value may be, for example, the average power of the input signals x1(n), x2(n), . . . xN (n). Alternatively, the sum of the input powers $S_{x,x}[n, k]$ may be used, as shown for example, by:

$$G[n,k] = 10\log_{10}\left(\frac{\hat{S}_{y_a,y_a}[n,k]}{S_{x,x}[n,k]}\right) \quad (7)$$

Where $S_{x,x}[n, k]$ is given by equation (5). In various examples, an average of the input signal powers may be used, or other values indicative of an input signal power may be used to provide a normalized value of the correlated power.

Furthermore, a frequency correction W[k] may be introduced to ensure that any frequency-dependent roll off in the ratio of the correlated power $\hat{S}_{y_a y_a}[n, k]$ and sum of the input powers $S_{x,x}[n, k]$ (e.g., due to a transfer between the accelerometer and ear) is corrected according to a user-defined importance, as follows:

$$G[n, k] = 10\log_{10}\left(\frac{\hat{S}_{y_a, y_a}[n, k]}{S_{x,x}[n, k]} W[k]\right) \quad (8)$$

Regardless of the method for determining G[n, k], the time gradient of G[n, k], for a given time and at a given frequency, may be determined by:

$$\Delta G[n,k]=G[n,k]-G[n-1,k] \quad (9)$$

where G [n, k] is the correlated power at a current (or most-recent) sample and a given frequency, e.g., frequency bin k, and G[n−1, k] is the correlated power at a previous sample, at the same frequency.

The time gradient calculator 500 will thus output ΔG [n, k], a value representative of the time gradient of the correlated power. This output will be input to average calculator 502 to be averaged over $T_A$ number of samples, as follows:

$$AvgGradient[n, k] = \frac{1}{T_A}\sum_{n=0}^{T_A} \Delta G[n, k] \quad (10)$$

to yield an average time gradient AvgGradient[n, k]. Average time gradient AvgGradient[n, k] will be representative of an average increase in correlated power and will thus be representative of an estimated degree of divergence over of the time period which the samples $T_A$ are received. The number of samples $T_A$ for which the time gradient ΔG [n, k] is averaged may be user defined—a short average time will yield a degree of rapid divergences, whereas a longer average will smooth rapid divergences and, thus, yield a degree of a longer divergence. For this reason, it may be useful to run both short-term averages and long-term averages simultaneously, as will be discussed below in connection with FIG. 5C.

Figure 5B:
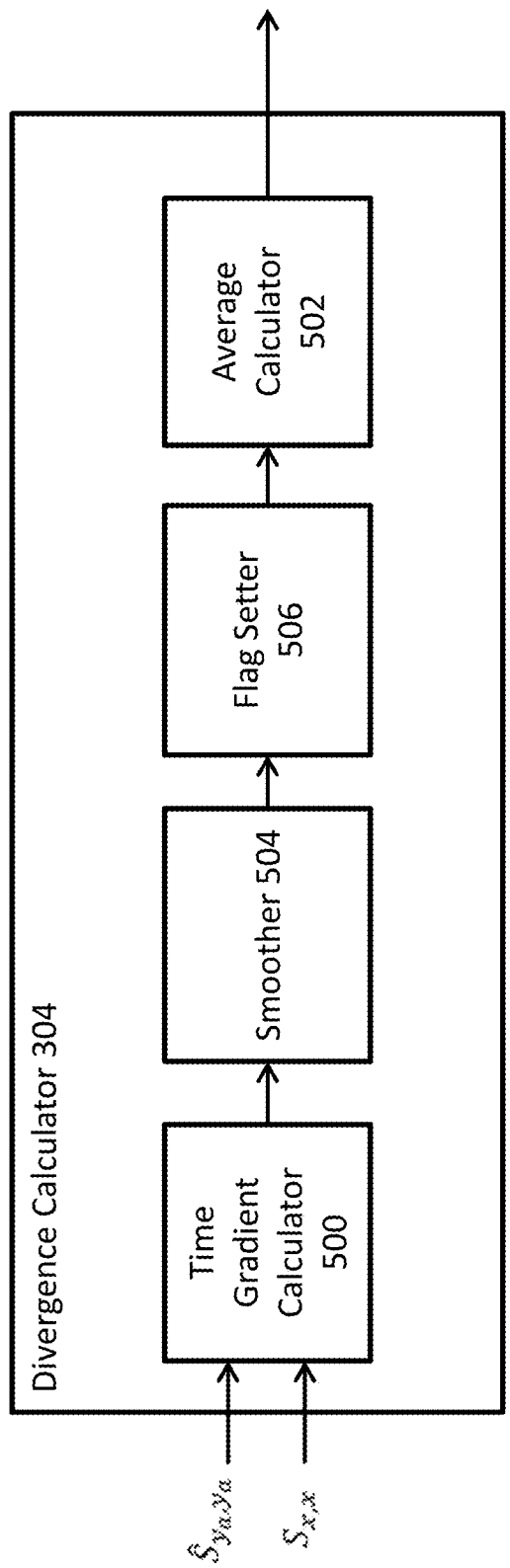
FIG. 5B depicts a block diagram of a divergence calculator, according to an example.

In addition to defining a time gradient, the time gradient calculator output ΔG [n, k] may, as shown in FIG. 5B, be first input to a smoother 504, which functions to smooth new values toward a mean value. For example, smoother may use an exponential moving average, given by:

$$\Delta G_{smooth}[n,k]=(1-\alpha)\Delta G[n,k]+\alpha\Delta G[n-1,k] \quad (11)$$

where α is a user-defined smoothing value between 0 and 1. If α is set, for example, to 0.1, then the result of the exponential moving average will weight time gradients calculated for new samples heavier than time gradients calculated for older samples. This will, thus, "discount" new samples by only a small margin, such that the smoothed time gradient $\Delta G_{smooth}$ [n, k] reflects changes in the gradient that occur over short periods of time (e.g., 2 minutes). Alternatively, if a is set to, for example, 0.99, new samples will be discounted heavily in favor of time gradients calculated for older samples. The net result of such an αvalue will be to weight older time gradients heavier, such that the resulting smoothed time gradient $\Delta G_{smooth}$ [n, k] better reflects changes in the gradient that occur over longer time periods (e.g., 5 minutes or longer).

The output $\Delta G_{smooth}$[n, k] of smoother 504 may be coordinated with an averaged sample length $T_A$ to focus on either short-term divergences or long-term divergences. Stated differently, a smaller α value will provide greater weight to newer time gradient values, as will a shorter $T_A$. Thus, a divergence calculator 304 may be focused on short-term divergences by selecting a smaller α and shorter $T_A$. Such a divergence calculator 304, however, will fail to recognize long-term divergences. Accordingly, divergence calculator 304 may alternately be focused on long-term divergences by selecting a higher a and a longer $T_A$.

It should be understood that the exponential moving average defined by equation (11) is only one way of smoothing values. Indeed any other suitable moving average or filter may be used to smooth the time gradient in favor of newer or older values.

The average time gradient AvgGradient[n, k] may not, however, accurately reflect the degree of divergence if a spike in the time gradient (either diverging or converging) occurs and resolves very quickly. Indeed, such a spike may have an inordinately large effect on the average time gradient AvgGradient[n, k], skewing the result one way or another. In addition, it can be difficult to set the threshold of threshold detector 306 accurately, because fast and slow diverging values may span a large range of positive values. As a result, slow divergences may be misidentified as converging.

Accordingly, as shown in FIG. 5B, each smoothed time gradient may be input to flag setter 506, which assigns a value of 1 or 0, depending on whether the time gradient is growing (i.e., above or equal to zero) or shrinking (i.e., less than zero), as follows:

$$GFlag[n, k] = \begin{cases} 0 \text{ if } \Delta G_{smooth}[n, k] < 0 \\ 1 \text{ otherwise} \end{cases} \quad (12)$$

Setting a flag according to equation (12) will thus broadly characterize the smoothed time gradient of each sample according to whether it is growing (diverging) or shrinking (converging). Of course, 1 and 0 are merely provided as examples—any other value for the flags may be used.

The output of flag setter 506 is thus a value representative of the time gradient of the correlated power, broadly characterizing each sample or smoothed sample according to whether the time gradient is above zero or below zero. The average calculator, in the example of FIG. 5B, will thus calculate the average of the value representative of the time gradient of the correlated as follows:

$$AvgGradient[n, k] = \frac{1}{T_A}\sum_{n=0}^{T_A} GFlag[n, k] \quad (13)$$

In this example, where flag values of 1 and 0 are used, the average time gradient AvgGradient[n, k] will fall between 0 and 1. If the value of AvgGradient[n, k] is closer to 0, it will be representative of a low degree of divergence; whereas, if it is closer to 1, it will be representative of a high degree of divergence. The average time gradient AvgGradient[n, k], in this example, may be considered a rough probability of divergence, as the values fall between 0 and 1.

Flag setter 506 may be used in conjunction with smoother 504 or without smoother 504. Thus, in different examples, flag setter 506 may receive an output from time gradient calculator 500 or from smoother 504. Similarly, the divergence calculator 304, in an alternative example, may input the output of smoother 504 directly to average calculator 502 without flag setter 506, in which case, the average time gradient of average calculator 502 will be calculated as:

$$AvgGradient[n, k] = \frac{1}{T_A}\sum_{n=0}^{T_A} \Delta G_{smooth}[n, k] \qquad (14)$$

Thus, in separate examples, the value representative of the time gradient may be calculated with or without smoother 504 and with or without flag setter 506.

Figure 5C:
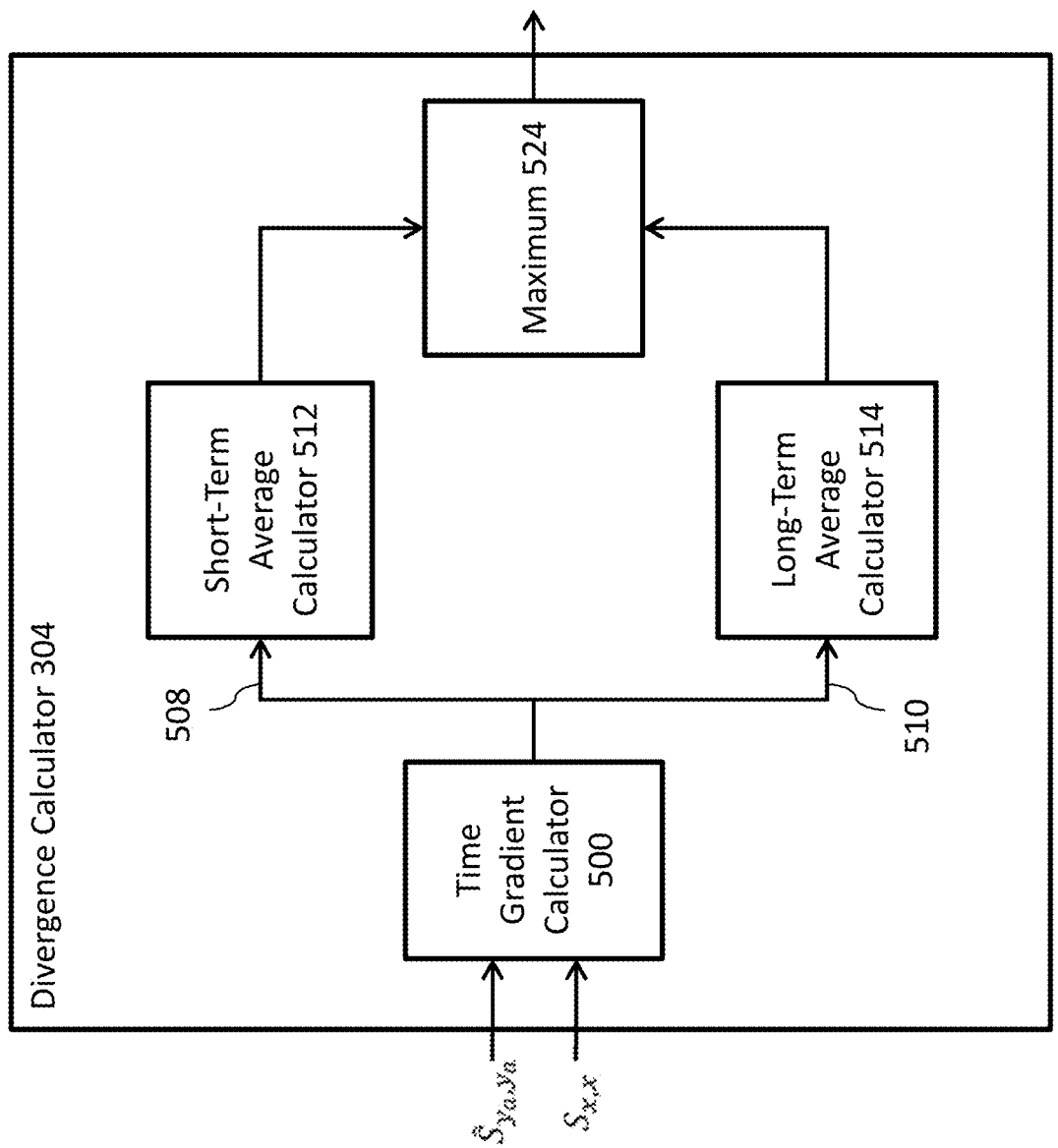
FIG. 5C depicts a block diagram of a divergence calculator, according to an example.

As alluded to above, divergence calculator 304 may calculate multiple probabilities AvgGradient[n, k] in parallel—each parallel branch utilizing a unique sample length $T_A$. An example of such is shown in FIG. 5C, where multiple branches—each including an average calculator—receive the output of time gradient calculator 500 and, using the calculated time gradient, respectively calculate a time average of unique length. In other words, each average calculator may apply a time average to the time gradient using a different sample length $T_A$. For example, as shown, a first branch 508 includes short-term average calculator 512, utilizing short sample length $T_A$ (e.g., 2 minutes) that results in a short-term average time gradient AvgGradient$_S$[n, k]. Whereas a second branch 510, for example, includes a long-term average calculator 514, utilizing a long sample length $T_A$ (e.g., 5 minutes) resulting in a long-term average time gradient AvgGradient$_L$[n, k]. It should be understood that, although two branches are shown, any number of branches may be used, each branch calculating a different length average time gradient.

Figure 5D:
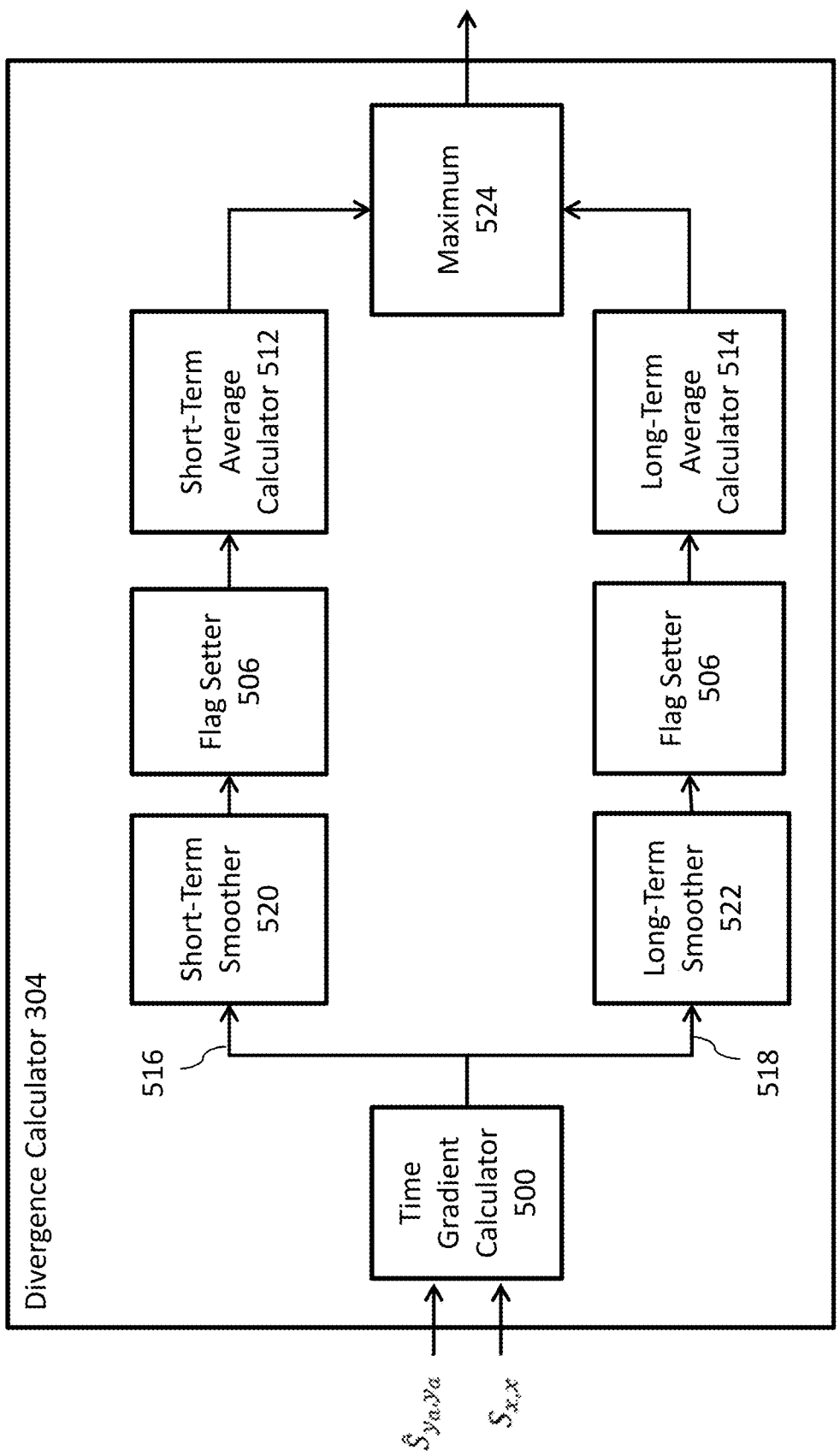
FIG. 5D depicts a block diagram of a divergence calculator, according to an example.

In another example, as shown in FIG. 5D, each branch may include a one or both of a smoother and/or a flag setter 506. The smoother of each branch may be configured to apply a value of a that coordinates with the length of the respective average calculator. For example, branch 516, which includes short-term average calculator 512, may include a short-term smoother 520, e.g., having small α value, thus more heavily weighting newer values. Whereas branch 518, which includes long-term average calculator 514, may include long-term smoother 522, having a large α value, thus more heavily weighting older values.

In either case, the output of the divergence calculator 304 may be calculated, by maximum 524, as the maximum of the branches per sample and frequency, such that:

$$AvgGradient[n,k]=\max(AvgGradient_L[n,k],AvgGradient_S[n,k]) \qquad (15)$$

Figure 5E:
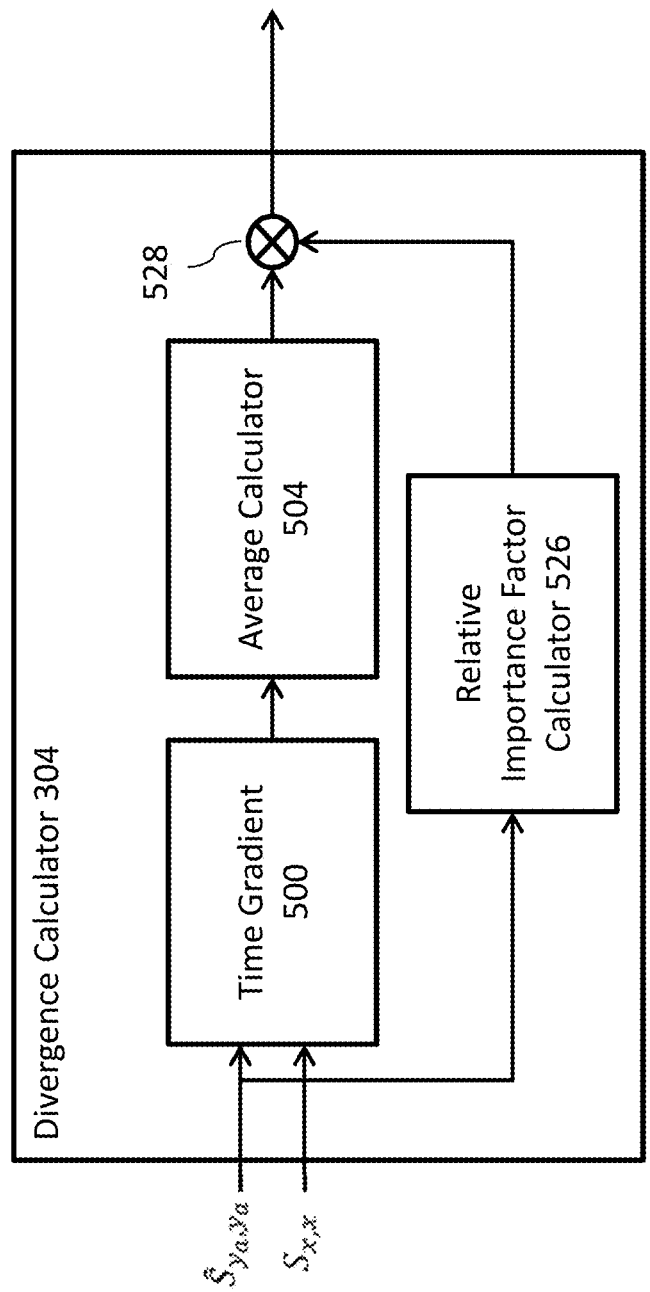
FIG. 5E depicts a block diagram of a divergence calculator, according to an example.

It may, however, be useful to weight certain frequency outputs of AvgGradient[n, k] higher than others. For example, at certain frequencies, the correlated power spectral density $\hat{S}_{y_a,y_a}[n, k]$ may have a null, whereas, at other frequencies the correlated power spectral density $\hat{S}_{y_a,y_a}[n, k]$ may have a peak. If there exists a peak in the error signal, it would be preferable to detect its divergence early on, since the growing peak will be more noticeable to a user; however, if there exists a null, it may be acceptable if its power increases an amount before the divergence is flagged. Thus, as shown in FIG. 5E, each frequency may be weighted according to relative importance by relative importance factor calculator 526, according to the following equation:

$$I[n, k] = \frac{\hat{S}_{y_a,y_a}[n, k] - \langle \hat{S}_{y_a,y_a}[n, k]\rangle_{min}}{\langle \hat{S}_{y_a,y_a}[n, k]\rangle_{max} - \langle \hat{S}_{y_a,y_a}[n, k]\rangle_{min}} \qquad (16)$$

Stated differently, each sample at a given frequency may be multiplied by a value corresponding to the quotient of the difference between the power of the sample at the frequency and the minimum expected correlated power, and the difference between the maximum expected correlated power and the minimum expected correlated power. If a sample possesses a large amount of power, it will quickly exceed the threshold value of the threshold detector, as its relative importance will be comparatively large. If a sample with a small amount of power starts to diverge, its relative importance will grow as its power increases, eventually flagging the threshold detector 306.

The divergence calculator output may then be given by multiplying, with multiplier 528, each average time gradient AvgGradient[n, k] of a certain frequency by the relative importance I[n, k] of the samples at the given frequency, as follows:

$$AvgGradientWeighted[n,k]=AvgGradient[n,k]I[n,k] \qquad (17)$$

It should be understood that the above example for calculating the relative importance, given by equation (15), is simply one example of a method for assigning a relative importance. Indeed, a relative importance may be assigned according to any method for weighting a given sample according to a power of the sample at the given frequency.

Returning to FIG. 3, as briefly described above, the value representative of a time gradient, output 306 from divergence calculator 304, is input to threshold detector 306. Threshold detector compares the time average of the value representative of a time gradient AvgGradient[n, k] to a threshold, to determine if the degree of divergence is great enough to warrant corrective action. The threshold may be user-defined and will depend, at least in part, on the nature of the average time gradient AvgGradient[n,k] calculated by divergence calculator 304. For example, if the divergence calculator does not employ a flag setter, then the threshold will likely be set to near zero, because the output values of time gradient calculator 500 and smoother 504 generally represent that the sample is diverging if it is greater than zero and converging if less than zero. If, however, a flag setter 506 is used, the threshold will likely be near to the midpoint between the low flag value and the high flag value. Thus, if, as described above, each output of smoother 504 (or time gradient calculator 500) below zero is assigned a low flag value of 0 and each output of smoother 504 greater than zero is assigned a high flag value of 1, then the midpoint between 0 and 1 is 0.5. Accordingly, it may be assumed that any output of divergence calculator 304 greater than 0.5 is indicative of divergence, and a corrective action may be taken. Likewise, if, in another example, the low flag value is set to 0 and the high flag value is set to 4, then the midpoint, indicative of a likelihood of divergence, may be 2.

However, it will be understood that the "sensitivity" of divergence detector 300 may be adjusted by varying the level of the threshold. Divergence detector 300 may be made more sensitive to divergences by lowering the threshold. For example, looking at the example of divergence detector 300 without a flag setter 506, the threshold may be set to −0.05 to require that the average time gradient (or smoothed time gradient) be generally converging. While lowering the threshold will make divergence detector 300 more sensitive to divergence (and will act sooner if one occurs), it will also be more sensitive to false positives. Accordingly, if divergence detector is to be made less susceptible to false positives, the threshold may be set above zero, such as at 0.05. Likewise, in the example with the flag setter 506 (e.g., low flag value of 0 and high flag value of 1) the threshold may be set to 0.6 to reduce false positives. It may be generally necessary to set the threshold above 0 (in the example without the flag setter 506) and above 0.5 (in the example with the flag setter) because random signals with zero mean and finite averaging will typically fluctuate around 0 or 0.5 (in the different examples), so a slightly larger threshold may be used to reduce false positives.

Figure 6A:
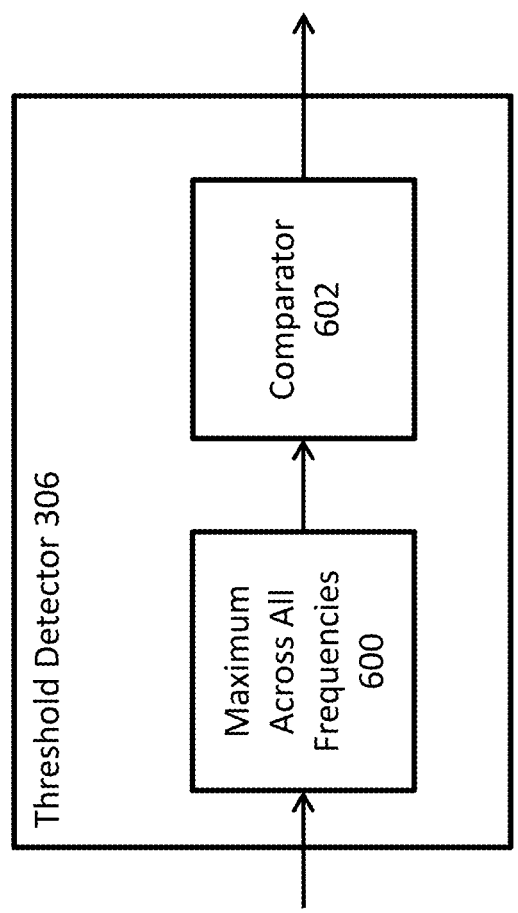
FIG. 6A depicts a block diagram of a threshold detector, according to an example.
Figure 6B:
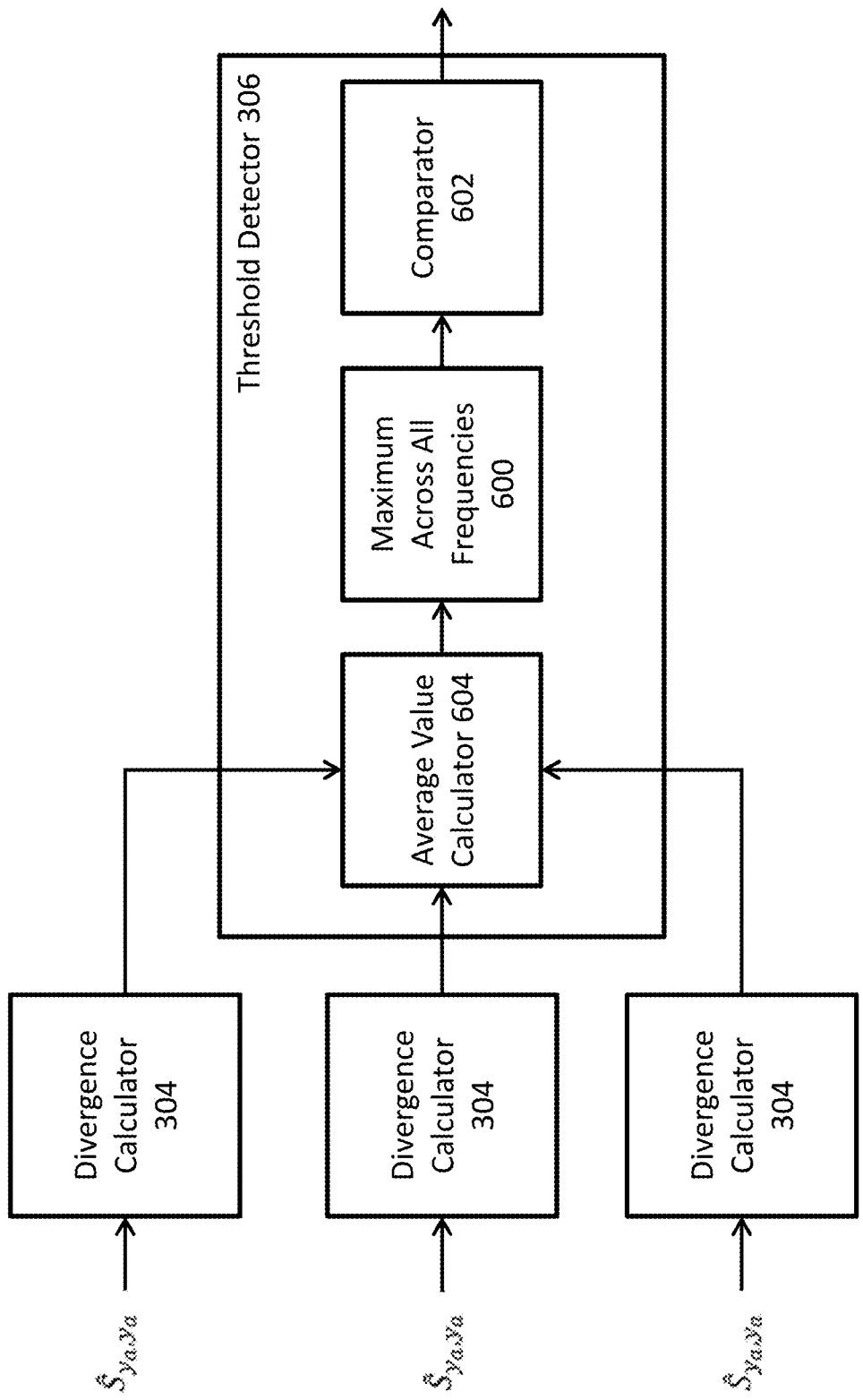
FIG. 6B depicts a block diagram of a threshold detector, according to an example.

FIG. 6A depicts an example of threshold detector 306. In this example, threshold detector 306 may employ a maximum across all frequencies 600 and a comparator 602. The maximum across all frequencies 600 determines the maximum average time gradient average time gradient AvgGradient[n, k], as output by divergence calculator 304, across each frequency. For example, the maximum across all frequencies calculator 600 may receive, per sample, an average time gradient AvgGradient[n, k] for each frequency, determine which frequency exhibits the highest average time gradient AvgGradient[n, k] and input that average to the comparator. The output of maximum across all frequencies may thus be characterized as follows:

$$\text{MaxAvgGradient}[n] = \max(\text{AvgGradient}[n,k])_{All\ Frequencies} \quad (18)$$

The comparator 602 may simply compare the received maximum average time gradient MaxAvgGradient[n] to the predetermined threshold, as described above. In an example, comparator 602 may output a final flag value, indicative of divergence or convergence. For example, comparator 602 may output a 0 if the maximum average time gradient MaxAvgGradient[n] is below the threshold and a 1 if the maximum average time gradient MaxAvgGradient[n] is above the threshold, as follows:

$$DivFlagFinal[n] = \begin{cases} 0 \text{ if Max}AvgGradient[n] < 0.6 \text{ or not Diverging} \\ 1 \text{ if Max}AvgGradient[n] \geq 0.6 \text{ or Diverging} \end{cases} \quad (19)$$

(0.6 is merely provided as an example threshold).

It should be understood that, in alternate examples, maximum across all frequencies calculator 600 may be excluded such that the comparator may compare each average time gradient AvgGradient[n, k] calculated for each frequency, rather than only the maximum average time gradient MaxAvgGradient[n] of all frequencies per sample.

If multiple error sensors are employed in the adaptive system (e.g., multiple microphones are employed in road-noise cancellation system 100) the correlated powers of each of these error signals may be respectively input to parallel divergence calculators 304. The output of these parallel divergence calculators 304 may be averaged, per sample and frequency, by average value calculator 604, the output of which may be input to maximum across all frequencies 600. In this example, the output of the maximum across frequencies may be characterized as follows:

$$\text{MaxAvgGradient}[n] = \max(\text{mean}(\text{AvgGradient}[n,k])_{All\ Signals})_{All\ Frequencies} \quad (20)$$

The above example, described in connection with FIGS. 3-6B, determines an average time gradient AvgGradient[n, k] on a per-sample, per-frequency basis. In other words, the output of divergence calculator 304 will output a respective degree of divergence for that sample for each frequency or at least a subset of frequencies output by STFT 400 of FIG. 4. However, in alternate embodiments, different values of power may be used. For example, the correlated power may be the average power across all frequencies per sample. Alternatively, the correlated may be calculated for only one frequency per sample. Accordingly, the average time gradient is not necessarily repeated for a plurality of frequencies. These examples will result in greater processing efficiency at the cost of reduced granularity.

As mentioned above, once the output of the divergence calculator exceeds the predetermined threshold of the threshold detector 306, a corrective action may be taken. Such a corrective action may be, in various examples: turn the adaptive system off, restart the adaptive system to default or stored previous convergent state, reduce the step size to slow adaptation of the adaptive system and reduce the effects of divergence with time, scale down the adaptive filters and "freeze" adaption in current state, or target certain frequencies of the adaptive filter that are diverging, by either filtering those frequencies to mitigate their gain, reducing the adaptive filter coefficients with respect to those frequencies, or freezing adaption corresponding to those frequencies. This final example, because it only targets certain frequencies, permits the remaining non-diverging frequencies of the adaptive filter to continue adapting as usual.

Figure 7A:
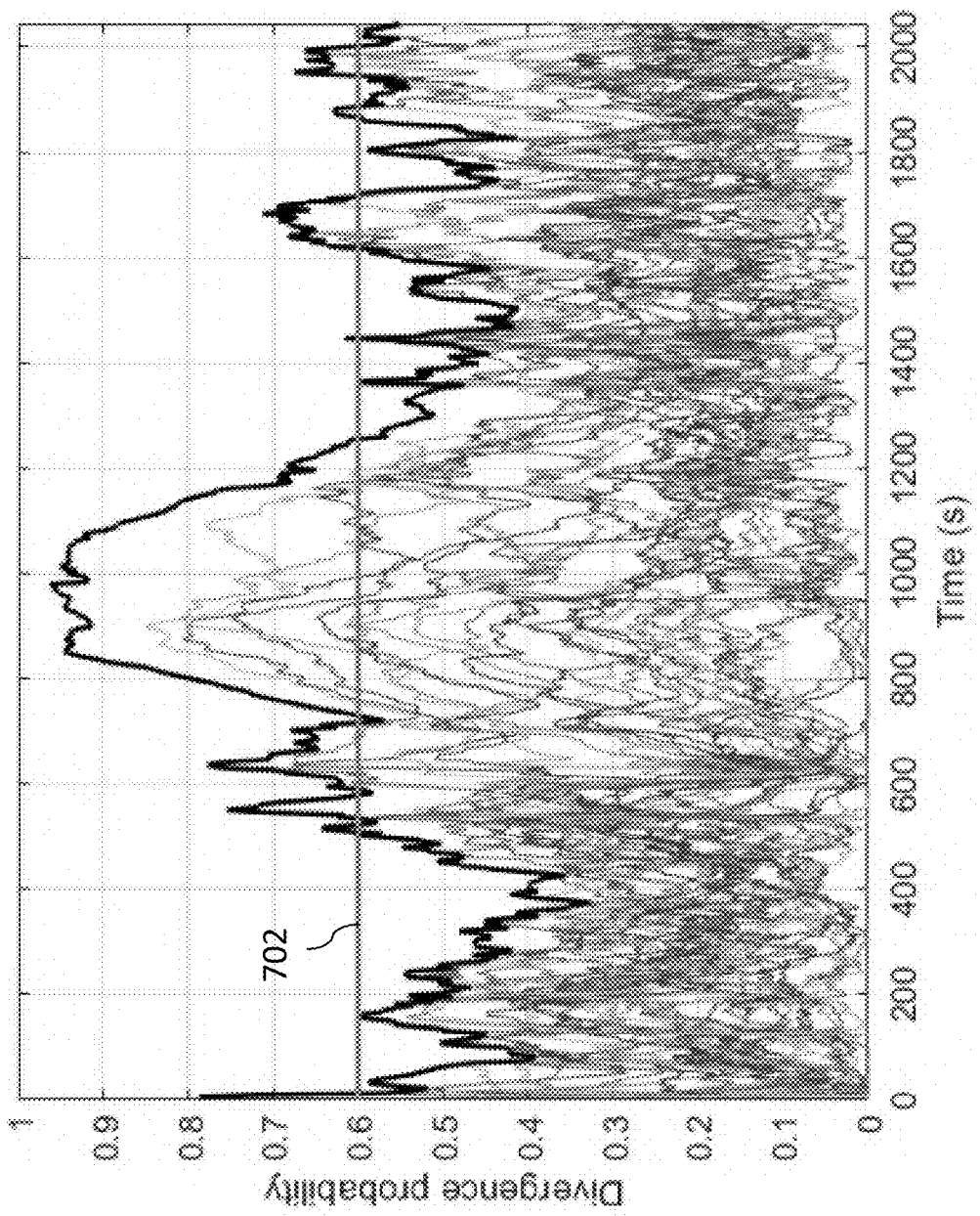
FIG. 7A depicts a graph of an example divergence calculator output, according to an example.
Figure 7B:
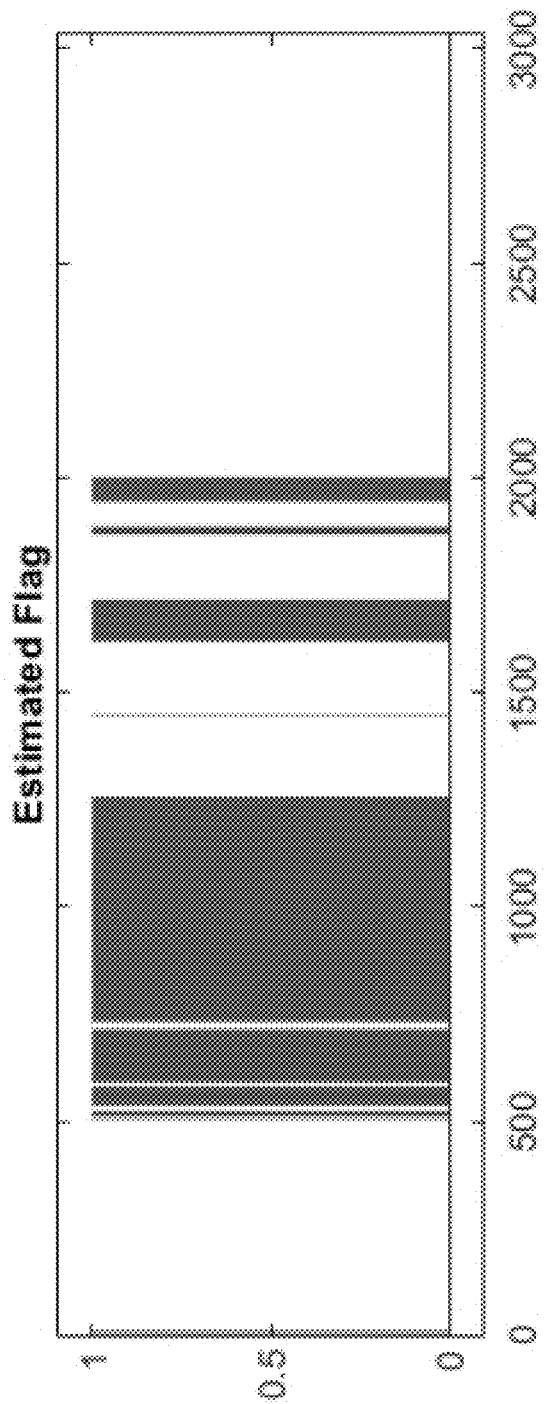
FIG. 7B depicts a graph of a flag set in response to an example divergence, according to an example.

FIG. 7A depicts a graph of an example average time gradient average time gradient AvgGradient[n, k], as output by a divergence calculator 304, in response to a road-noise cancellation system. Threshold line 700, overlaid on FIG. 7A depicts an example threshold for determining a divergence has occurred. FIG. 7B depicts a corollary output of threshold detector 306. In each instance that the average time gradient AvgGradient[n, k] exceeds the threshold in FIG. 7A, the flag is set to 1 at the output of threshold detector 306 in FIG. 7B.

The above-described system and method for detecting divergence improves the functioning of a computer by allowing a computer to detect when an adaptive system is diverging, something not previously performable by a computer. Furthermore, the above-described system improves the functioning of a computer by permitting a computer to take corrective action once a divergence is detected in the adaptive system.

The functionality described herein, or portions thereof, and its various modifications (hereinafter "the functions") can be implemented, at least in part, via a computer program product, e.g., a computer program tangibly embodied in an information carrier, such as one or more non-transitory machine-readable media or storage device, for execution by, or to control the operation of, one or more data processing apparatus, e.g., a programmable processor, a computer, multiple computers, and/or programmable logic components.

A computer program can be written in any form of programming language, including compiled or interpreted languages, and it can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a network.

Actions associated with implementing all or part of the functions can be performed by one or more programmable processors executing one or more computer programs to perform the functions of the calibration process. All or part of the functions can be implemented as, special purpose logic circuitry, e.g., an FPGA and/or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. Components of a computer include a processor for executing instructions and one or more memory devices for storing instructions and data.

While several inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, and/or method described herein. In addition, any combination of two or more such features, systems, articles, materials, and/or methods, if such features, systems, articles, materials, and/or methods are not mutually inconsistent, is included within the inventive scope of the present disclosure.

What is claimed is:

1. A system for detecting divergence in a noise-cancellation system, comprising:
    a controller configured to:
        determine a power of a component of an error signal, the component being correlated to at least one reference signal;
        determine an average value, over a first time period, of a value representative of a time gradient of the power of the component of the error signal; and
        determine whether the average value is greater than a threshold.

2. The system of claim 1, wherein the controller is further configured to normalize the power of the component according to a total power of the at least one reference signal.

3. The system of claim 1, wherein the value representative of the time gradient is a smoothed time gradient of the power of the component.

4. The system of claim 3, wherein the smoothed time gradient discounts new values of the time gradient.

5. The system of claim 3, wherein the smoothed time gradient is an exponential moving average of the time gradient.

6. The system of claim 1, wherein the value representative of the time gradient is set to a first flag value when the time gradient of the power of the component is above a gradient threshold and set to a second flag value when the time gradient of the power of the component is below the gradient threshold.

7. The system of claim 1, wherein the controller is configured to weight at least one frequency of the component of the error signal higher than at least one other frequency of the component of the error signal.

8. The system of claim 1, wherein the controller is configured to determine a second average value of a second value representative of the time gradient of the power of the component over a second time period; and to determine whether the average value or the second average value is greater than the threshold.

9. The system of claim 8, wherein the second time period is greater than the first time period.

10. The system of claim 1, wherein the controller is further configured to:
    determine a second power of a component of a second error signal, the component of the second error signal being correlated to the at least one reference signal;
    determine a second average value, over the first time period, of a value representative of a time gradient of the second power of the component of the second error signal; and
    determine whether the second average value is greater than the threshold.

11. The system of claim 1, further comprising: an error sensor outputting the error signal.

12. The system of claim 1, further comprising: at least one reference sensor outputting the at least one reference signal.

13. A method for detecting divergence in a noise-cancellation system, comprising:
    determining a power of a component of an error signal, the component being correlated to at least one reference signal;
    determining an average value, over a first time period, of a value representative of a time gradient of the power of the component of the error signal; and
    determining whether the average value is greater than a threshold.

14. The method of claim 13, further comprising the steps of normalizing the power of the component according to a total power of the at least one reference signal.

15. The method of claim 13, wherein the value representative of the time gradient is a smoothed time gradient of the power of the component.

16. The method of claim 15, wherein the smoothed time gradient discounts new values of the time gradient.

17. The method of claim 15, wherein the smoothed time gradient is an exponential moving average of the time gradient.

18. The method of claim 13, wherein the value representative of the time gradient is set to a first flag value when the time gradient of the power of the component is above a gradient threshold and set to a second flag value when the time gradient of the power of the component is below the gradient threshold.

19. The method of claim 13, further comprising the steps of weighting at least one frequency of the component of the error signal higher than at least one other frequency of the component of the error signal.

20. The method of claim 13, further comprising the steps of determining a second average value of a second value representative of the time gradient of the power of the component over a second time period; and determining whether the average value or the second average value is greater than the threshold.

\* \* \* \* \*